US008643043B2

(12) United States Patent
Shimizu et al.

(10) Patent No.: US 8,643,043 B2
(45) Date of Patent: Feb. 4, 2014

(54) LED LIGHTING DEVICE

(75) Inventors: Hirotaka Shimizu, Kyoto (JP); Mitsunori Nagashima, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 252 days.

(21) Appl. No.: 13/202,035

(22) PCT Filed: Feb. 19, 2010

(86) PCT No.: PCT/JP2010/052531

§ 371 (c)(1),
(2), (4) Date: Aug. 17, 2011

(87) PCT Pub. No.: WO2010/095710

PCT Pub. Date: Aug. 26, 2010

(65) Prior Publication Data

US 2011/0297971 A1 Dec. 8, 2011

(30) Foreign Application Priority Data

Feb. 19, 2009 (JP) ................................ 2009-037005

(51) Int. Cl.
*H01L 33/00* (2010.01)

(52) U.S. Cl.
USPC .......... 257/98; 257/88; 257/99; 257/E33.058; 257/E33.071; 257/E33.074

(58) Field of Classification Search
USPC .......... 257/88, 89, 98, 99, E33.055, E33.056, 257/E33.057, E33.058, E33.071, E33.074; 362/249.02, 249.04, 611, 612, 613
See application file for complete search history.

(56) References Cited

U.S. PATENT DOCUMENTS

2009/0196019 A1 * 8/2009 Hsiao et al. ................. 362/97.2

FOREIGN PATENT DOCUMENTS

| | | | |
|---|---|---|---|
| CN | 2903657 | Y | 5/2007 |
| CN | 201093222 | Y | 7/2008 |
| CN | 201173419 | Y | 12/2008 |
| JP | U-6-54103 | | 7/1994 |
| JP | 2002-93204 | | 3/2002 |
| JP | 2003-303504 | | 10/2003 |
| JP | 2008-120210 | | 5/2008 |

* cited by examiner

*Primary Examiner* — Benjamin Sandvik
*Assistant Examiner* — Leslie Pilar Cruz
(74) *Attorney, Agent, or Firm* — Hamre, Schumann, Mueller & Larson, P.C.

(57) ABSTRACT

An LED lighting device A1 includes a plurality of LED chips 32, an LED unit 2 in which the LED chips 32 are mounted, and a mount 1 holding the LED unit 2. This arrangement allows the appearance or structure of the LED lighting device to be adapted for various applications. For instance, the LED lighting device may be mounted on an indoor ceiling to illuminate the floor surface or an upper part of a wall surface.

13 Claims, 14 Drawing Sheets

LED LIGHTING DEVICE

TECHNICAL FIELD

The present invention relates to an LED lighting device including a plurality of LED chips and used for illuminating indoor floors or indoor walls.

BACKGROUND ART

FIG. 18 is a sectional view showing an example of conventional. LED lighting device (see Patent Document 1, for example). The LED lighting device X illustrated in the figure includes a substrate 91 in the form of an elongated rectangle, a plurality of LED chips 92 mounted on the substrate 91, a tube 93 housing the substrate 91, terminals 94, and a circuit 95 for lighting the LED chips 92. On the substrate 91 is formed a wiring, not shown, connected to the LED chips 92 and the terminals 94. The LED lighting device X is structured such that the LED modules 92 can be turned on when the terminals 94 are fitted into inlet ports of a socket of a general-use fluorescent lighting fixture. Since the LED chips 92 have low power consumption and a long life, the use of the LED lighting device X in place of a fluorescent lamp is advantageous in terms of cost and effect to the environment. The general-use fluorescent lighting fixture herein refers to lighting fixtures widely used for interior lighting as the main application, and more specifically, lighting fixtures which use, for example in Japan, a commercial power supply of 100 V and to which a JIS C7617 straight-tube fluorescent lamp or a JIS C7618 circular fluorescent lamp can be attached.

However, lighting fixtures for conventional fluorescent lamps are designed on the assumption that the terminal 94 exists at each end of the lamp and that the light is emitted in all directions around the circumference. Thus, when a plurality of LED lighting devices X are attached to a lighting fixture designed for a plurality of fluorescent lamps arranged in series, a dark portion exists between adjacent LED lighting devices X, which causes poor appearance. Further, even when a user wishes to illuminate only a certain part of a wall with light, the LED lighting device X emits light also to other portions. To prevent this, e.g. a light-shielding cover that covers half the circumference of the LED lighting device X needs to be provided.

Patent Document 1: JP-U-H06-54103

DISCLOSURE OF THE INVENTION

Problems to be Solved by the Invention

The present invention has been proposed under the circumstances described above. It is therefore an object of the present invention to provide an LED lighting device adapted for various applications.

Means for Solving the Problems

According to the present invention, there is provided an LED lighting device comprising a plurality of LED chips, an LED unit in which the LED chips are mounted, and a mount holding the LED unit.

In a preferred embodiment of the present invention, the LED unit is elongated in a first direction, the LED chips emit light mainly along a second direction perpendicular to the first direction, and the mount is formed with a recess that is open in the second direction and that accommodates the LED unit.

In a preferred embodiment of the present invention, the LED unit is provided with a connector extending in a direction crossing the first direction and connected to the LED unit, and the LED unit reaches ends of the mount that are spaced from each other in the first direction.

In a preferred embodiment of the present invention, the mount includes a holder including an engagement piece for holding the LED unit, and the LED unit is formed with a fixing engagement groove for engagement with the engagement piece.

In a preferred embodiment of the present invention, the holder includes a pair of the engagement pieces arranged to sandwich the LED unit in a third direction perpendicular to both of the first and the second directions. The engagement pieces define a distance between them in the third direction reducing as proceeding in the direction opposite from a light emission direction of the LED chips along the second direction. The LED unit is provided with a pair of the fixing engagement grooves on sides spaced from each other in the third direction.

In a preferred embodiment of the present invention, the holder includes a flexible portion that is elastically deformable to move the paired engagement pieces away from each other in the third direction.

In a preferred embodiment of the present invention, the LED unit is elongated in a first direction and held by the mount rotatably relative to the mount around the first direction. The LED chips emit light mainly along a second direction perpendicular to the first direction.

In a preferred embodiment of the present invention, the LED unit is provided with a pair of shafts at ends spaced from each other in the first direction. Each of the shafts includes a root portion and an end portion rotatable relative to the root portion. The mount is provided with a pair of holders each including a fit portion for fitting to the end portion.

In a preferred embodiment of the present invention, the holders include flexible portions, respectively, which are elastically deformable to move the fit portions away from each other in the first direction.

In a preferred embodiment of the present invention, each of the holders includes a hook portion that is positioned inward from the fit portion in the first direction and that engages a portion of the shaft that is closer to the root portion than a portion that fits to the fit portion is.

In a preferred embodiment of the present invention, the LED unit includes a support member that is U-shaped in cross section. The support member supports the LED chips at the bottom and opens in a direction opposite from the light emission direction of the LED chips along the second direction.

In a preferred embodiment of the present invention, the support member accommodates a power conversion portion for converting received electric power into output electric power for supply to the LED chips.

In a preferred embodiment of the present invention, the support member comprises a bracket U-shaped in cross section and a strip-like substrate attached to the outer side of the bottom of the bracket. The LED chips are mounted to the substrate. The substrate has a length in the first direction and a width in a third direction perpendicular to both of the first and the second directions.

In a preferred embodiment of the present invention, the bracket includes a base portion which is U-shaped in cross section and to which the substrate is attached, and an outer portion that covers at least part of the base portion and edges of the substrate spaced from each other in the third direction but exposes the LED chips.

In a preferred embodiment of the present invention, the LED unit further includes a cover for transmitting light from the LED chips while diffusing the light.

In a preferred embodiment of the present invention, the cover has a strip-like shape elongated in the first direction and is formed with a pair of engagement pieces at edges spaced from each other in a third direction perpendicular to both of the first and the second directions. The support member is formed with a pair of cover engagement grooves that engage the engagement pieces.

In a preferred embodiment of the present invention, one of the engagement pieces includes a stepped portion that shifts an end of the engagement piece inward in the third direction, whereas the other one of the engagement pieces includes an engagement surface oriented in a light emission direction along the second direction and an inclined surface deviated from the engagement surface in a direction opposite from the light emission direction along the second direction and extending inward in the third direction as proceeding in the direction opposite from the light emission direction along the second direction. One of the cover engagement grooves that engages the engagement piece including the stepped portion includes a recess dented in the direction opposite from the light emission direction along the second direction. One of the cover engagement grooves that engages the engagement piece including the engagement surface and the inclined surface includes an engagement surface that engages the engagement surface and a projection deviated from the inclined surface in the direction opposite from the light emission direction along the second direction.

In a preferred embodiment of the present invention, the base portion and the outer portion are fastened to each other by an engagement member including an axis extending in the third direction.

In a preferred embodiment of the present invention, the mount includes a space for allowing movement of the engagement pieces caused by deformation of the flexible portion in attaching the LED unit to the holder.

Other features and advantages of the present invention will become more apparent from the detailed description given below with reference to the accompanying drawings.

BEST MODE FOR CARRYING OUT THE INVENTION

Preferred embodiments of the present invention are described below with reference to the accompanying drawings.

Figure 1:
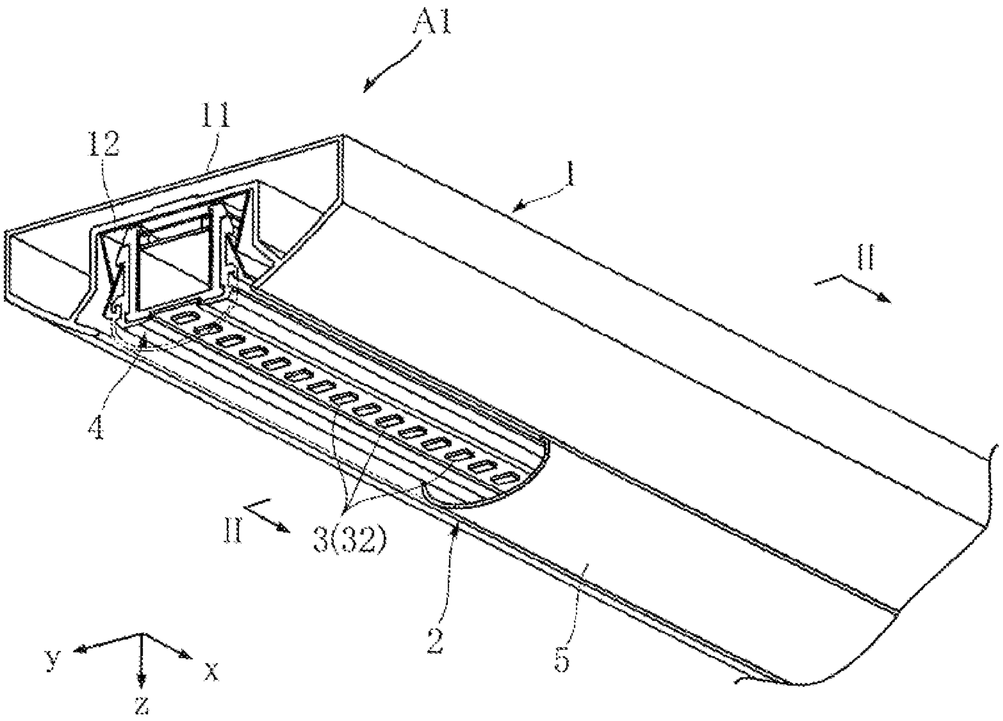
FIG. 1 is a schematic perspective view showing an LED lighting device according to a first embodiment of the present invention.
Figure 2:
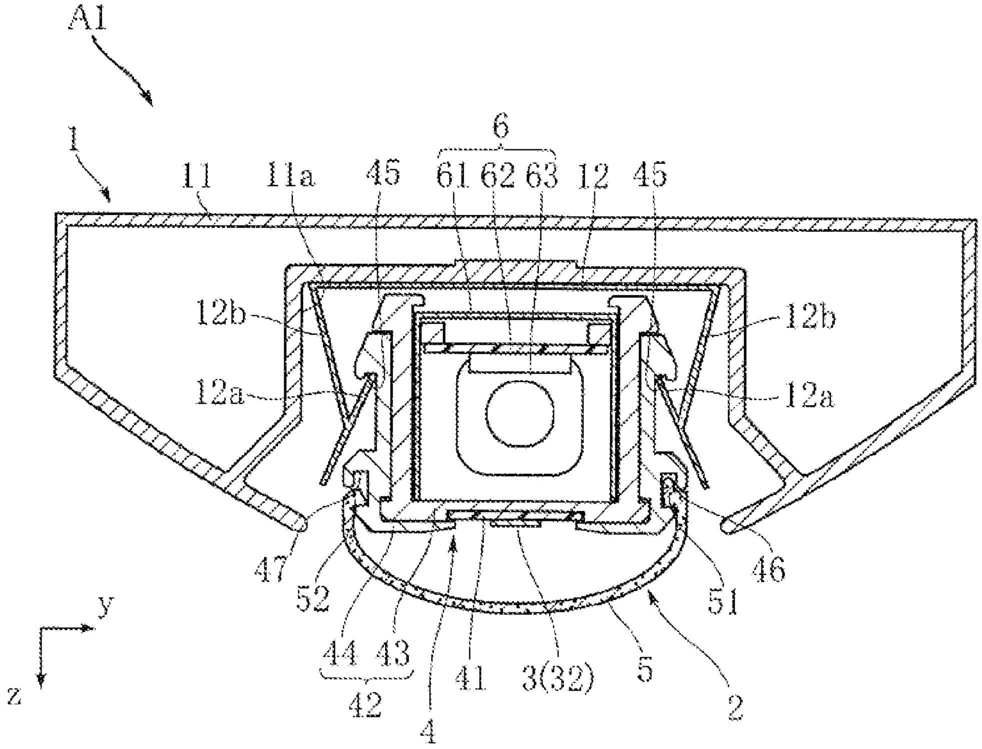
FIG. 2 is a sectional view taken along lines II-II in FIG. 1.

FIGS. 1 and 2 show an LED lighting device according to a first embodiment of the present invention. The LED lighting device A1 of this embodiment includes a mount 1 and an LED unit 2. The LED lighting device A1 is used to illuminate the floor when attached to e.g. an indoor ceiling, and is about 1227 mm in length, about 120 mm in width and about 38 mm in height.

The mount 1 includes a main body 11 and a plurality of holders 12. The main body 11 is elongated in direction x and made of e.g. aluminum. The main body 11 includes a recessed portion 11*a*. The recessed portion 11*a* is provided for receiving the LED unit 2. The main body 11 includes a curved surface having a curvature continuous across the recessed portion 11*a*.

Figure 9A:
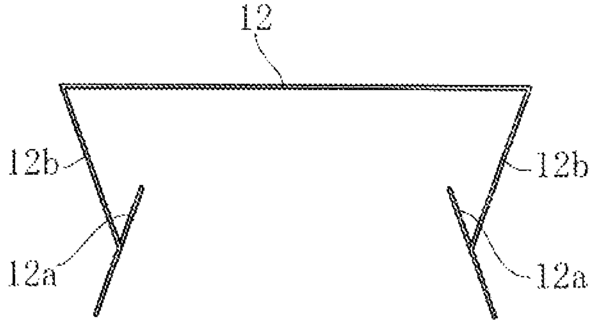
FIG. 9A is a front view of a holder of the LED lighting device shown in FIG. 1.
Figure 9B:
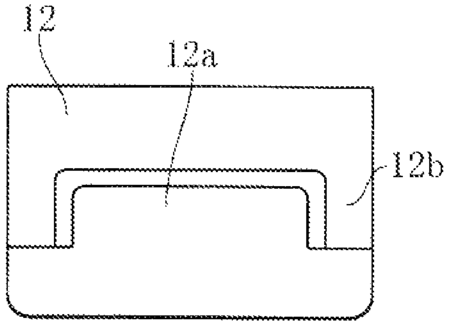
FIG. 9B is a side view of the holder of the LED lighting device shown in FIG. 1.
Figure 9C:
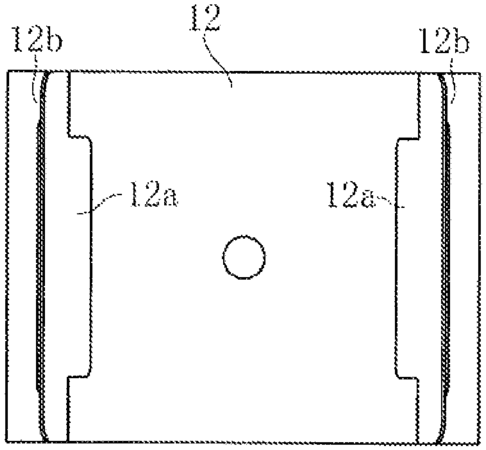
FIG. 9C is a plan view of the holder of the LED lighting device shown in FIG. 1.

The holder 12 is made by e.g. bending a metal plate, and includes a pair of engagement pieces 12*a* and a pair of flexible portions 12*b*. As shown in FIGS. 9A, 9B and 9C, the flexible portions 12*b* support the engagement pieces 12*a*. When an external force is applied to the flexible portions 12*b*, the flexible portions 12*b* elastically deform to move the engagement pieces 12*a* toward or away from each other. The engagement pieces 12*a* are portions to engage the LED unit 2 and inclined to come close to each other as proceeding upward in FIG. 9A. In this embodiment, a plurality of holders 12 are arranged in the recessed portion 11*a*.

Figure 3:
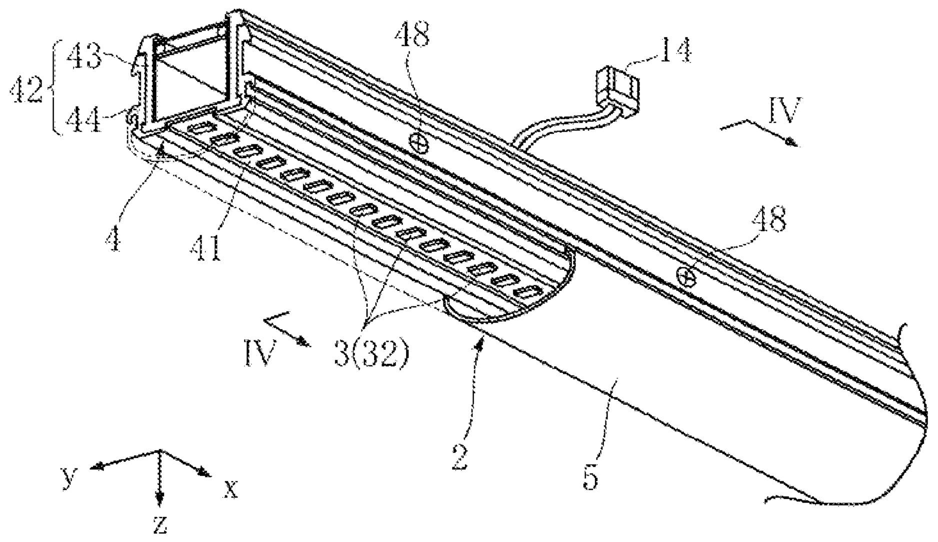
FIG. 3 is a schematic perspective view of the LED unit of the LED lighting device shown in FIG. 1.
Figure 4:
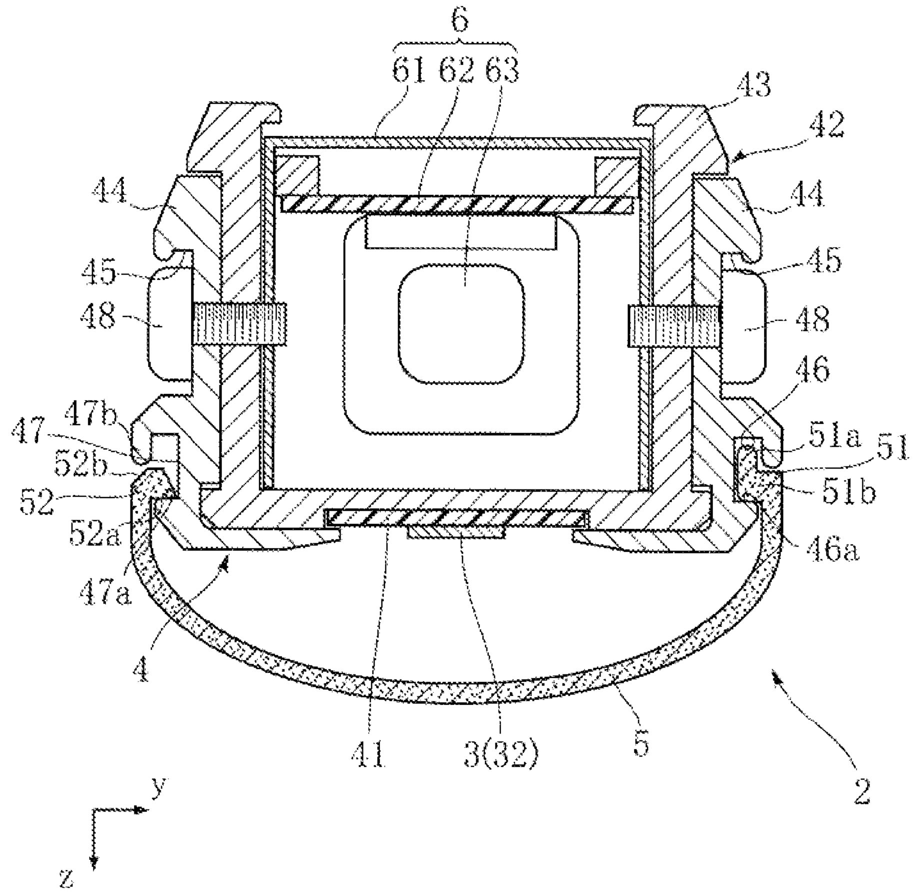
FIG. 4 is a sectional view taken along lines IV-IV in FIG. 3.

As shown in FIGS. 3 and 4, the LED unit 2 includes a plurality of LED modules 3, a support member 4, a cover 5 and a power conversion portion 6. The LED unit 2 has a length reaching the ends of the mount 1 in direction x (about 1220 mm).

Figure 5:
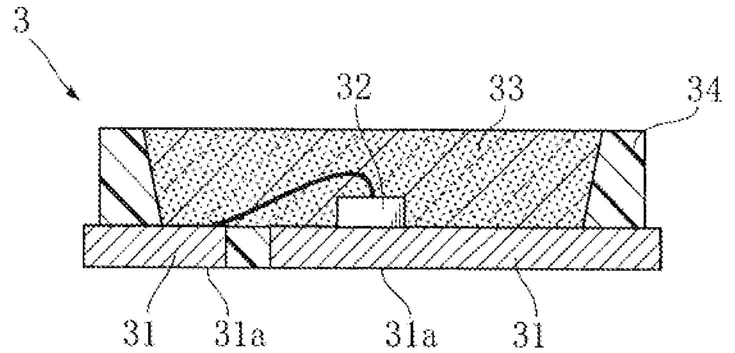
FIG. 5 is a sectional view showing an LED module used for the LED unit shown in FIG. 3.

As shown in FIG. 5, the LED module 3 includes a pair of leads 31, an LED chip 32, a sealing resin 33 and a reflector 34. The leads 31 are made of e.g. a Cu alloy, and the LED chip 32 is mounted on one of the leads. The surface of the lead 31 that is opposite from the surface on which the LED chip 32 is mounted constitutes a mount terminal 31*a* used for surfacemounting the LED module 3. The LED chip 32 is the light source of the LED module 3 and can emit e.g. blue light. The sealing resin 33 is provided for protecting the LED chip 32. The sealing resin 33 comprises a light-transmitting resin containing a fluorescent material that emits yellow light when excited by the light from the LED chip 31. This arrangement allows the LED module 3 to emit white light. Instead of the fluorescent material that emits yellow light, use may be made of a mixture of a fluorescent material that emits red light and a fluorescent material that emits green light. The reflector 34 is made of e.g. white resin and reflects the light traveling sideways from the LED chip 32 upward.

As shown in FIGS. 3 and 4, the support member 4 is provided for supporting the LED modules 3 and supplying power to the LED modules, and includes a substrate 41 and a bracket 42.

The substrate 41 has a strip-like shape having a length in direction x and a width in direction y and is made of e.g. a glass-fiber-reinforced epoxy resin. In this embodiment, 288 LED modules 3 are mounted on the substrate 41.

As shown in FIG. 4, the bracket 42 includes a base portion 43 and a pair of outer portions 44. The base portion 43 and the outer portions 44 are made of e.g. aluminum. The base portion 43 is substantially U-shaped in cross section. The substrate 41 is attached to the outer side of the bottom of the base portion. Each of the outer portions 44 substantially covers one of the sides of the base portion 43 and one of the edges of the substrate 41 which are spaced from each other in direction y. As shown in FIGS. 3 and 4, the base portion 43 and the outer portions 44 are fastened to each other by using a plurality of bolts 48.

As shown in FIG. 4, each of the outer portions 44 is formed with an engagement groove 45. The engagement groove 45 is elongated in direction x and dented in a direction opposite from the light emission direction of the LED module 3 along direction z. The engagement groove 45 engages the engagement piece 12*a* of the holder 12.

One of the outer portions 44 is further formed with an engagement groove 46. The engagement groove 46 is elongated in direction x and dented in the direction opposite from the light emission direction of the LED module 3 along direction z. The engagement groove 46 includes an engagement surface 46*a*. The engagement surface 46*a* is elongated in direction x and oriented in the direction opposite from the light emission direction along direction z. The other one of the outer portions 44 is formed with an engagement groove 47. The engagement groove 47 includes an engagement surface 47*a* and a projection 47*b*. The engagement surface 47*a* is elongated in direction x and oriented in the direction opposite from the light emission direction along direction z. The projection 47*b* is deviated from the engagement surface 47*a* in the direction opposite from the light emission direction along direction z and projects in the light emission direction.

As shown in FIG. 3, the cover 5 has a strip-like shape elongated in direction x and arcuate in cross section, and is made of e.g. a milky white resin that transmits light from the LED modules 3 while diffusing the light. As shown in FIG. 4, the cover 5 is formed with engagement pieces 51 and 52 at the edges.

The engagement piece 51 includes an end 51*a* and a stepped portion 51*b*. The end 51*a* projects in the direction opposite from the light emission direction along direction z. The stepped portion 51*b* is so formed as to shift the end 51*a* inward in direction y. The engagement piece 51 engages the engagement groove 46. Specifically, the end 51*a* is received in the engagement groove 46. The stepped portion 51*b* is held in contact with the engagement surface 46*a*.

The engagement piece 52 includes an engagement surface 52*a* and an inclined surface 52*b*. The engagement surface 52*a* is oriented in the light emission direction along direction z. The inclined surface 52*b* is deviated from the engagement surface 52*a* in the direction opposite from the light emission direction along direction z and faces the projection 47*b* of the support member 4 in direction z. The inclined surface 52*b* is so inclined as to extend inward in direction y as proceeding in the direction opposite from the light emission direction along direction z. The engagement piece 52 engages the engagement groove 47 of the support member 4. Specifically, the engagement surface 52*a* is held in contact with the engagement surface 47*a* of the support member 4.

Figure 6:
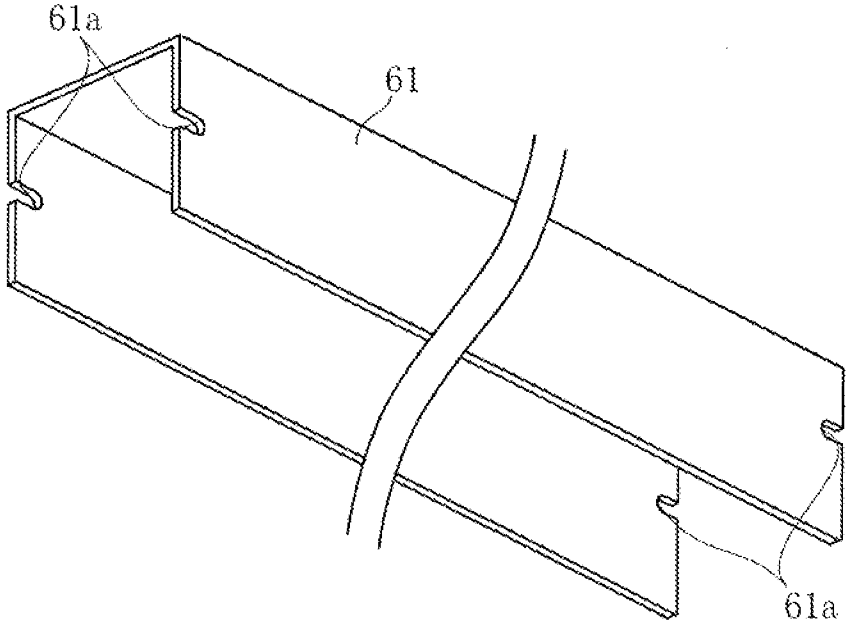
FIG. 6 is a schematic perspective view showing the case of the power conversion portion of the LED unit shown in FIG. 3.

The power conversion portion 6 has the function of converting electric power from e.g. commercial AC 100 V to DC 36 V, and is housed in the support member 4. The power conversion portion 6 includes a case 61, a power supply substrate 62 and a plurality of electronic components 63. The case 61 is substantially U-shaped in cross section and made of e.g. metal. As shown in FIG. 6, the case 6 has a plurality of cutouts 61*a* at the ends. Of each of the bolts 48 shown in FIG. 4, the portion projecting inward from the base portion 43 engages the cutout 61*a*, whereby the power conversion portion 6 is fixed. The power supply substrate 62 is fixed to the case 61, and the electronic components 63 are mounted on the power supply substrate. Examples of the electronic components 63 include a transformer, a rectifier and a transistor for constant-current control. As shown in FIG. 3, the connector 14 extends from the power conversion portion 6. The connector 14 is connected to a connector (not shown) attached to the mount 1.

In this embodiment; two power conversion portions 6 are provided, and each power conversion portion 6 supplies electric power to 144 LED modules 3. The 144 LED modules 3 are divided into twelve groups each of which consists of twelve LED modules connected in series to each other. These groups are connected parallel with each other. With this arrangement, DC power of about 3 V and about 20 mA is supplied to each LED chip 32.

The advantages of the LED lighting device A1 are described below.

According to this embodiment, the LED lighting device A1 has a relatively flat shape and does not project remarkably from the ceiling. Thus, the appearance in the room is not deteriorated and gives people good impression. Further, when a plurality of LED lighting devices A1 are arranged in series to each other, the LED units 2 of adjacent LED devices A1 are positioned close to each other. Thus, a large non-light-emitting area is not produced between adjacent LED devices A1. Thus, the LED devices can illuminate a wider area of an indoor floor and give people an impression that the appearance is good.

Accommodating the power conversion portions 6 in the U-shaped support member 4 allows the LED lighting device A1 to have a relatively small height.

The outer portions 44 press the substrate 41. Thus, dropping of the substrate 41 is prevented even when the LED lighting device A1 is used for a long period of time as attached to the ceiling.

Figure 7:
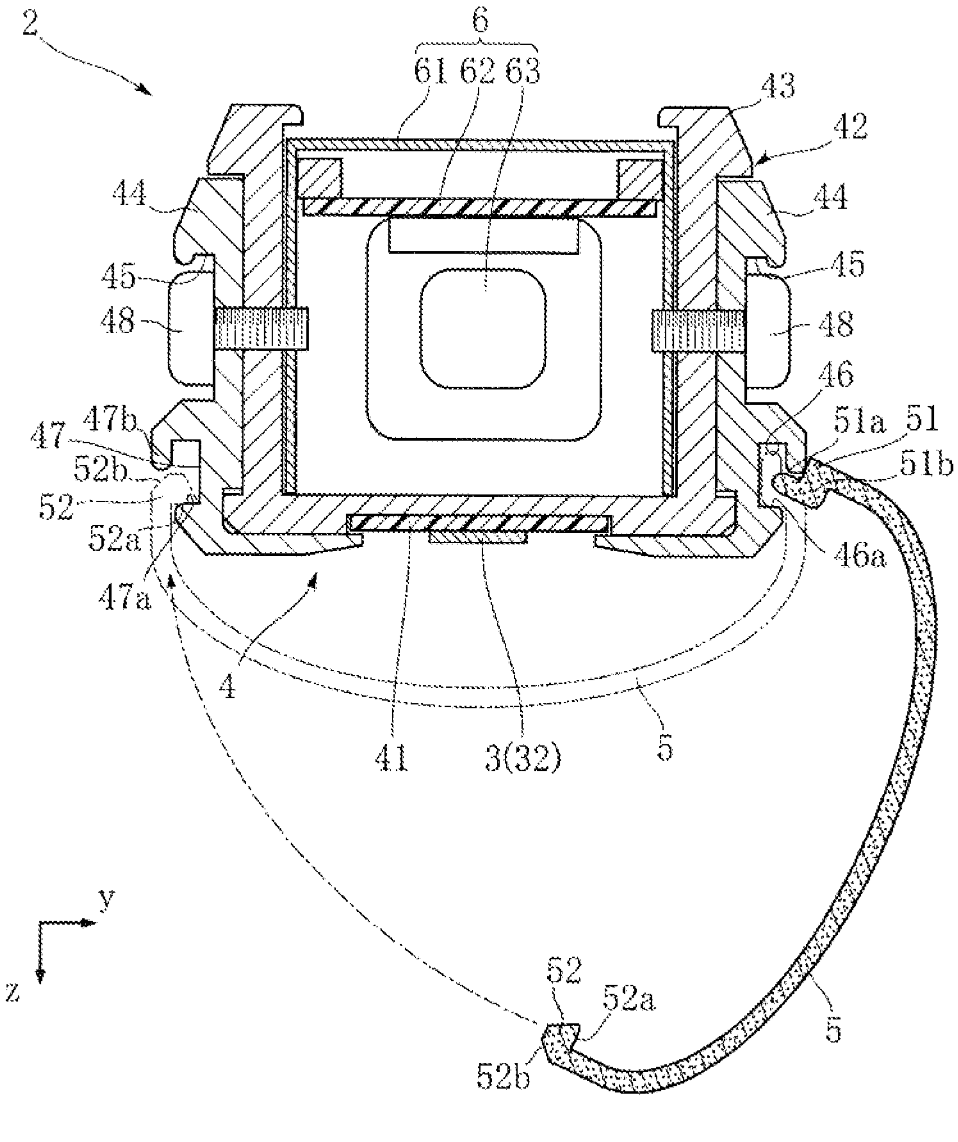
FIG. 7 is a sectional view showing how a cover is attached in assembling the LED unit shown in FIG. 3.

FIG. 7 shows how the cover 5 is attached to the support member 4 in assembling the LED unit 2. As shown in the figure, the engagement piece 51 of the cover 5 is first brought into engagement with the engagement groove 46 of the support member 4. Then, the cover 5 is rotated around the engagement piece 51 to move the engagement piece 52 closer to the engagement groove 47. Then, the engagement piece 52 is pushed into the engagement groove 47, so that the engagement surface 47*a* and the engagement surface 52*a* are brought into contact with each other. Thus, attaching the cover 5 is easy.

Figure 10:
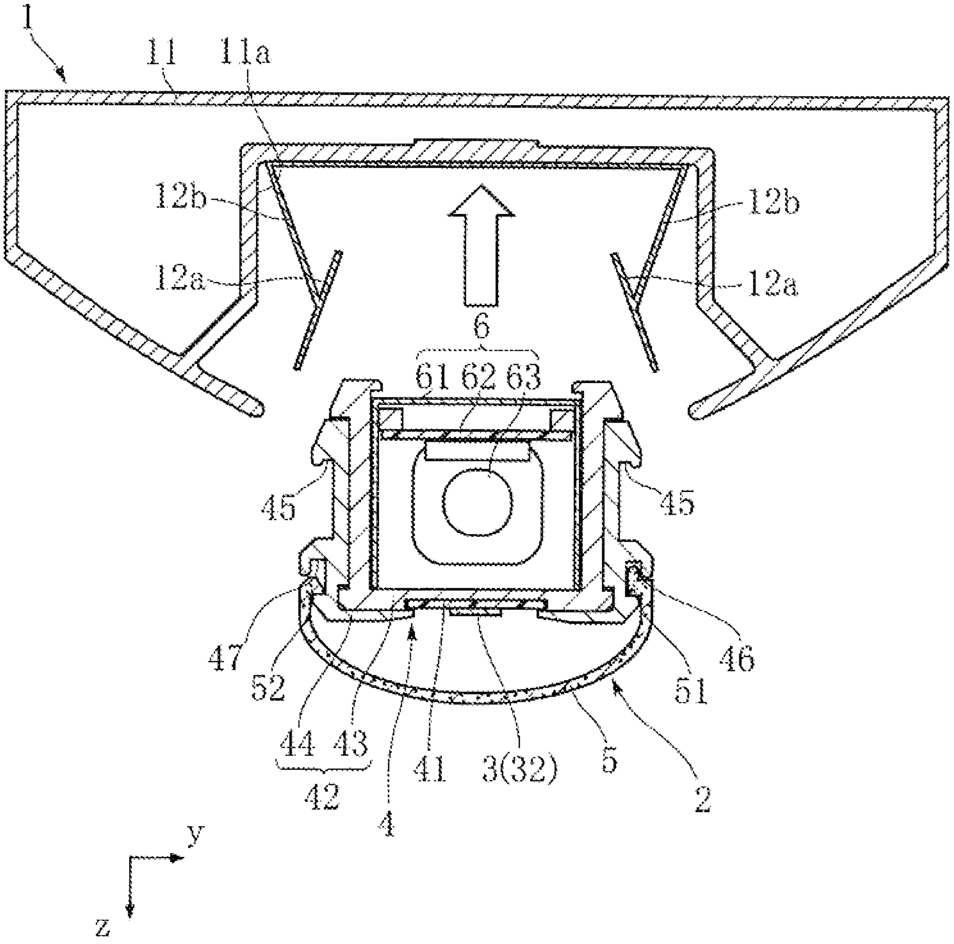
FIG. 10 is a sectional view showing how the LED unit is attached to the mount in assembling the LED lighting device shown in FIG. 1.

FIG. 10 shows how the LED unit 2 is attached to the mount 1 in assembling the LED lighting device A1. As clearly shown in the figure, the LED unit 2 is first moved from below closer to the mount 1 fixed to e.g. a ceiling. Then, the LED unit 2 is pushed between the engagement pieces 12*a* of the holder 12. The flexible portions 12*b* flex slightly so that the paired engagement pieces 12*a* move away from each other. Then, as shown in FIG. 2, the engagement pieces 12*a* come into engagement with the engagement grooves 45 of the support member 4. Thus, attaching the LED unit 2 is easy.

Figure 8:
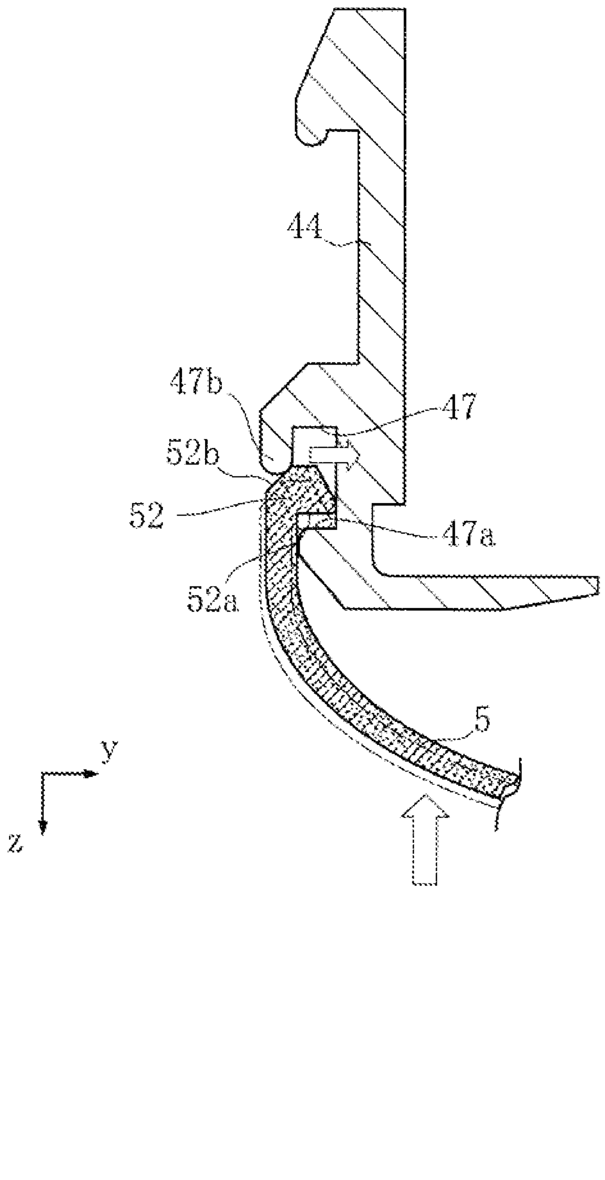
FIG. 8 is a schematic sectional view showing the state in which the cover of the LED unit shown in FIG. 3 is pushed.

In pushing the LED unit 2, a strong force may be applied to the cover 5. At this time, as shown in FIG. 8, the engagement piece 52 moves into a deeper portion of the engagement groove 47 in direction z. As a result, the inclined surface 52*b* comes into contact with the projection 47*b*, so that a force to move the engagement piece 52 inward in direction y acts on the engagement piece. Thus, even when the cover 5 is pushed strongly, the cover 5 does not come off the support member 4.

Figure 11:
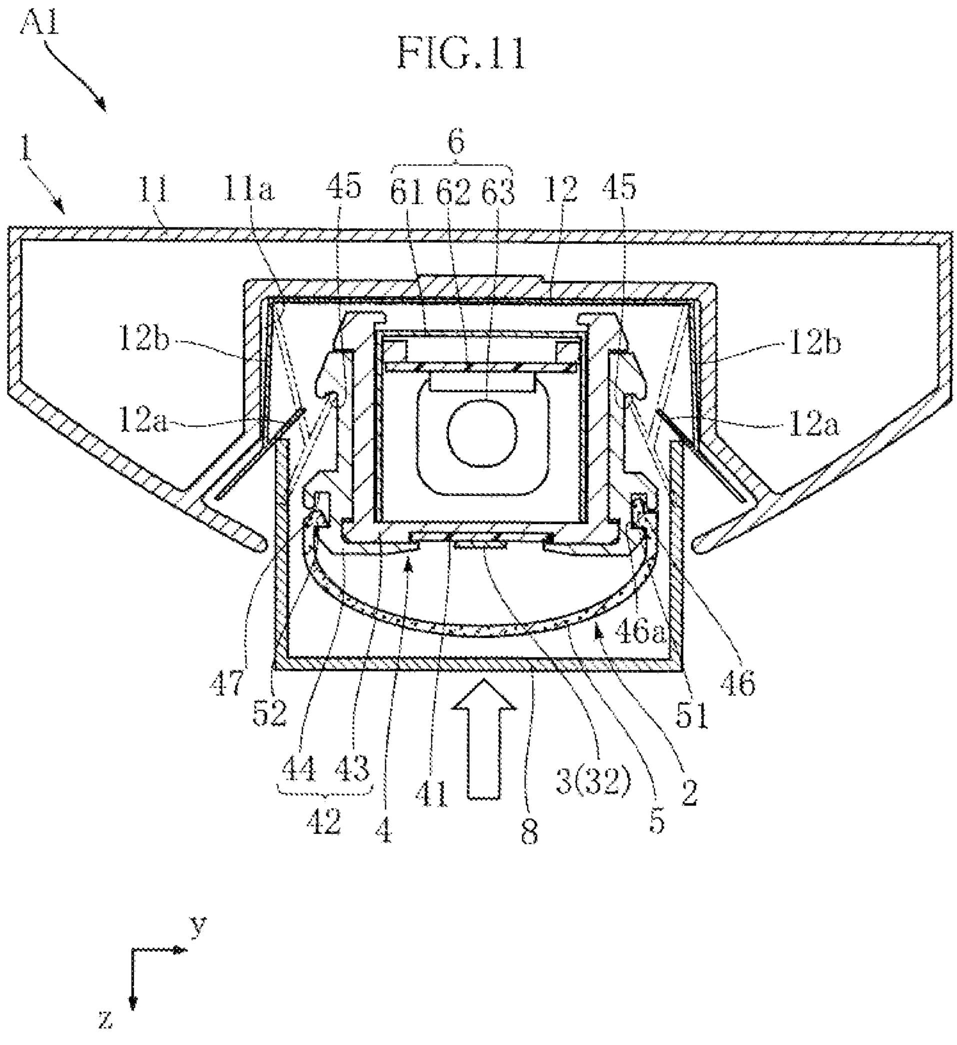
FIG. 11 is a sectional view showing how the LED unit of the LED lighting device shown in FIG. 1 is detached.

FIG. 11 shows how the LED unit 2 is detached from the mount 1. As shown in the figure, a detaching jig 8 generally U-shaped in cross section is prepared. The edges of the detaching jig 8 are pressed against the engagement pieces 12*a* of the holder 12. As a result, the flexible portions 12*b* deform elastically so that the paired engagement pieces 12*a* move away from each other. As a result, the engagement pieces 12*a* disengage from the engagement grooves 45. Thus, according to the LED lighting device A1, detachment of the LED unit 2 from the mount 1 is easy.

FIGS. 12-17B show other embodiments of the present invention. In these figures, the elements that are identical or similar to those of the foregoing embodiment are designated by the same reference signs as those used for the foregoing embodiment.

Figure 12:
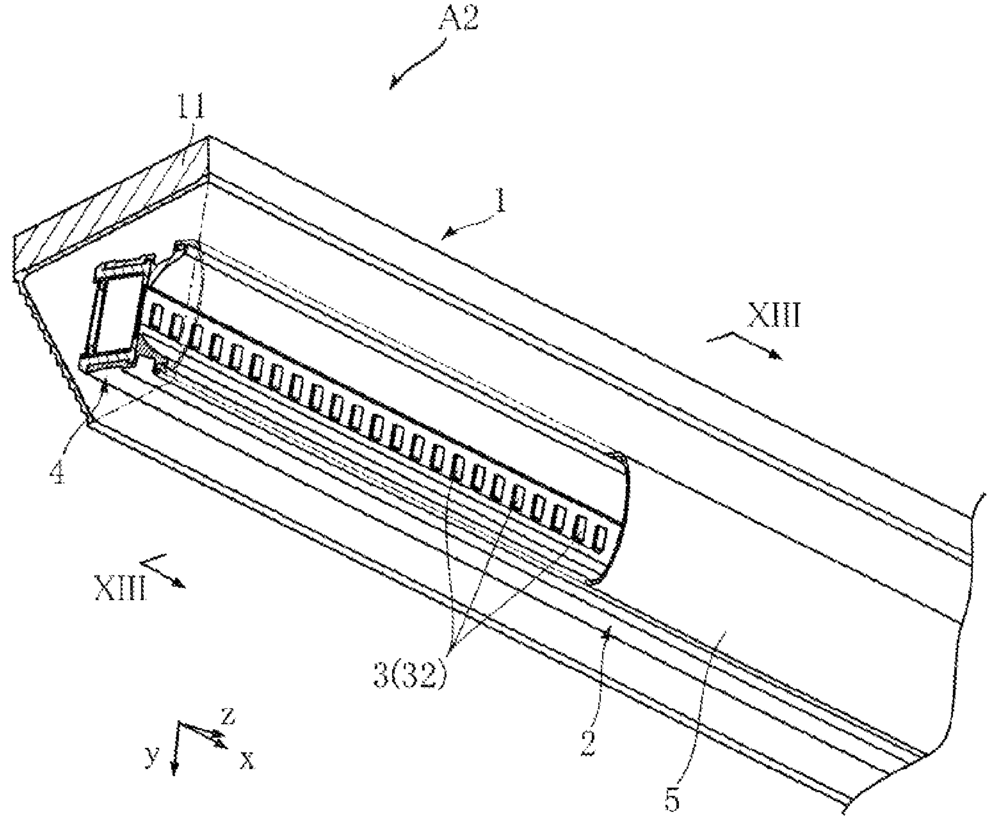
FIG. 12 is a schematic perspective view showing an LED lighting device according to a second embodiment of the present invention.
Figure 13:
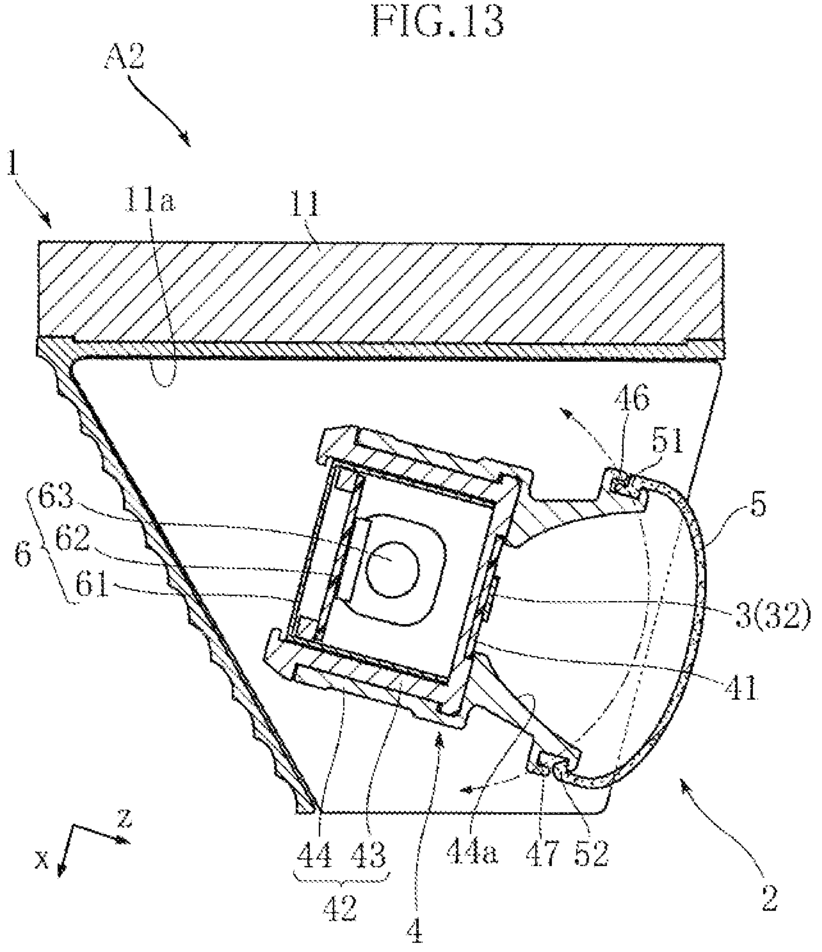
FIG. 13 is a sectional view taken along lines XIII-XIII in FIG. 12.

FIGS. 12 and 13 show an LED lighting device according to a second embodiment of the present invention. The LED lighting device A2 of this embodiment is designed to be attached to the ceiling of e.g. a shop at a position relatively close to an edge, to illuminate a portion of the wall which is not covered by a shelf. The LED lighting device A2 is about 1290 mm in length, about 73 mm in width and d about 50 mm in height.

The main body 11 of the mount 1 is generally wedge-shaped in cross section and is open on the wall side when attached to the ceiling. The LED unit 2 is housed in the mount 1 and rotatable around the direction x.

Figure 14:
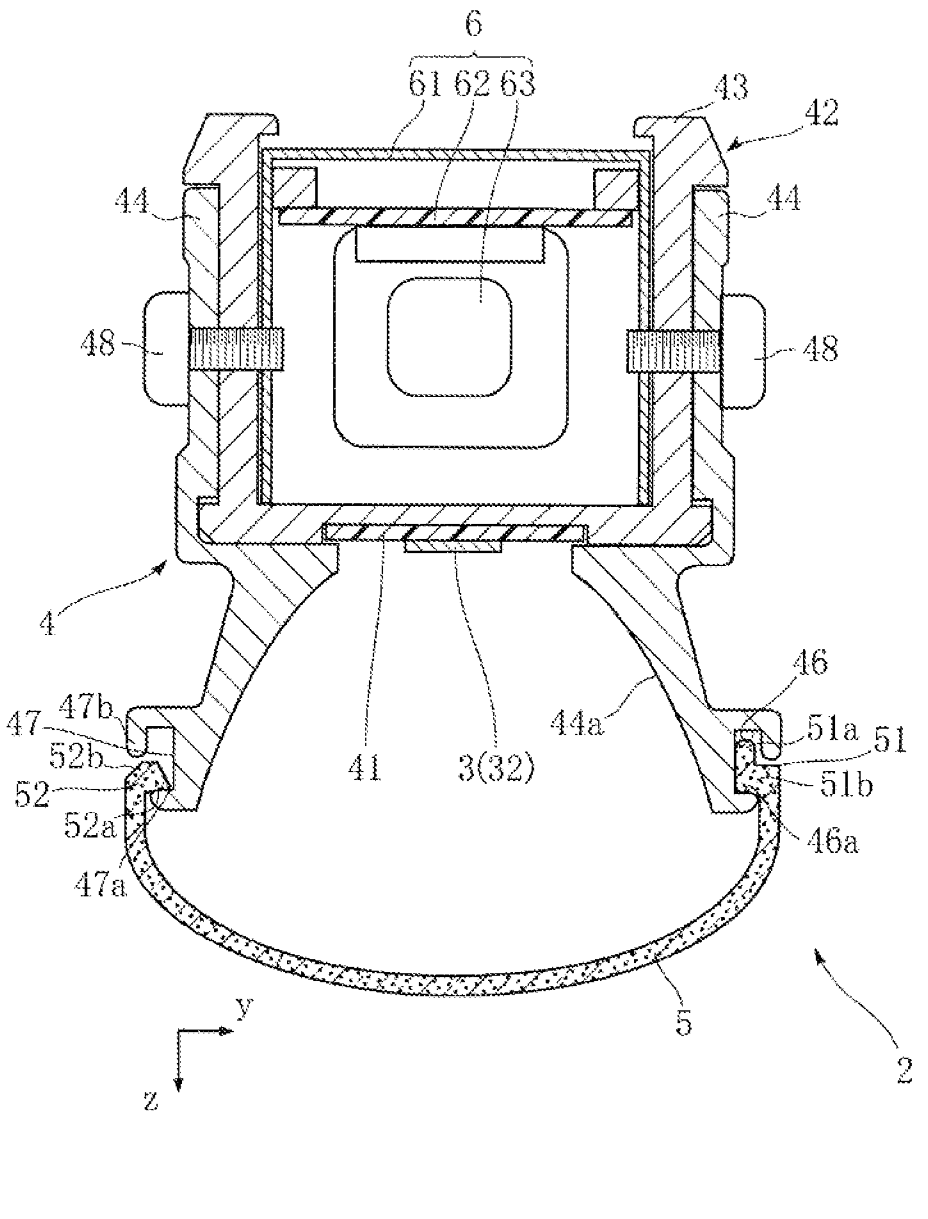
FIG. 14 is a sectional view of the LED unit of the LED lighting device shown in FIG. 12.

As shown in FIG. 14, in this embodiment, a reflector 44*a* is provided at the outer portions 44 of the bracket 42 of the support member 4. The light emitted from the LED modules 3 in direction y is reflected by the reflector 44*a* downward in direction z. Engagement grooves 46 and 47 are provided at the edges of the reflector 44*a*, and the cover 5 is attached.

Figure 15:
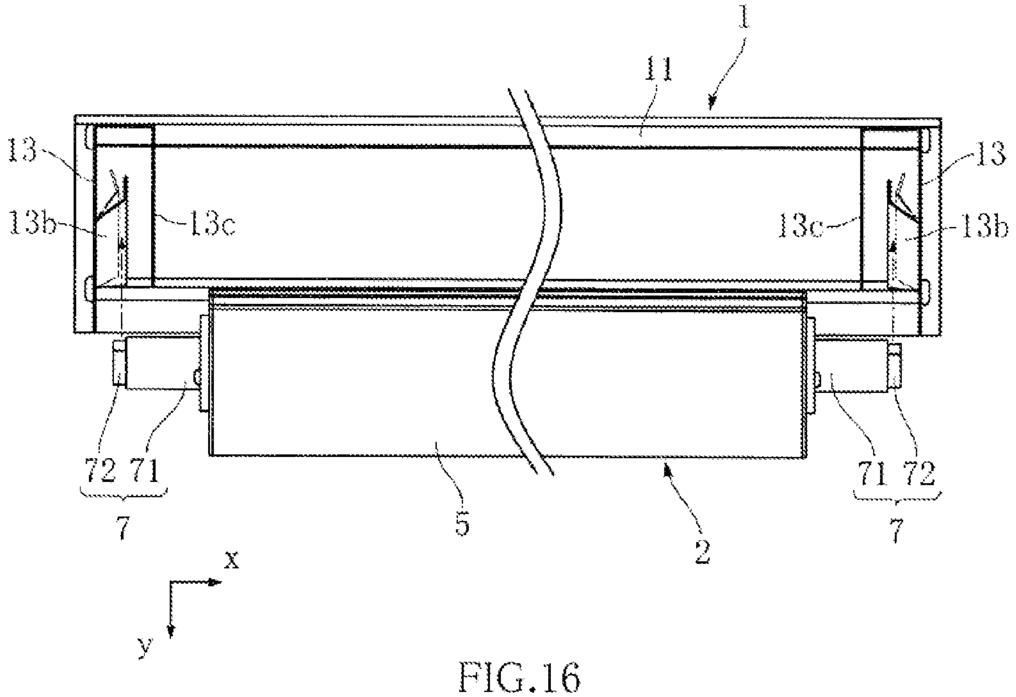
FIG. 15 is a schematic plan view showing how the LED unit is attached to the mount in assembling the LED lighting device shown in FIG. 12.

As shown in FIG. 15, the LED unit 2 of this embodiment includes a pair of shafts 7. The shafts 7 are attached to the ends of the support member 4 spaced away from each other in direction x. Each of the shafts 7 includes a root portion 71 and an end portion 72. The root portion 71 is attached to the support member 4. The end portion 72 is rotatable relative to the root portion 71. Specifically, the resistance in rotating the end portion 72 is so large that the use of a tool such as pinchers is necessary.

Figure 17A:
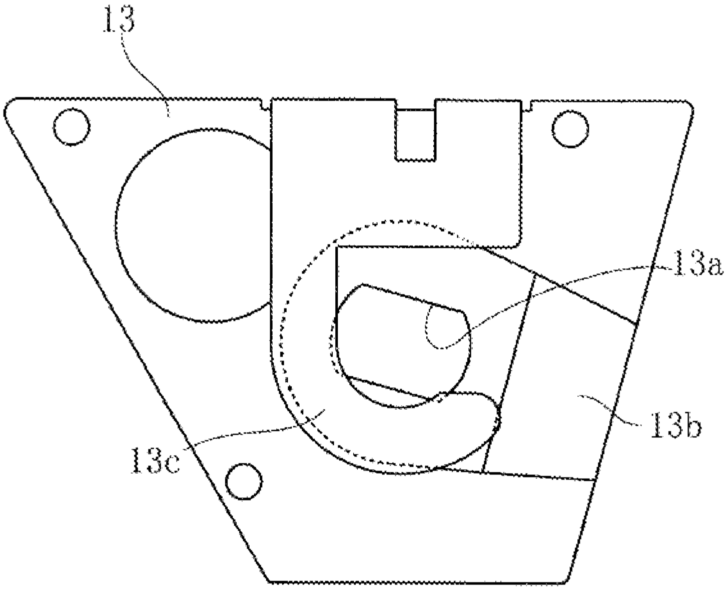
FIG. 17A is a front view of the holder of the LED lighting device shown in FIG. 12.
Figure 17B:
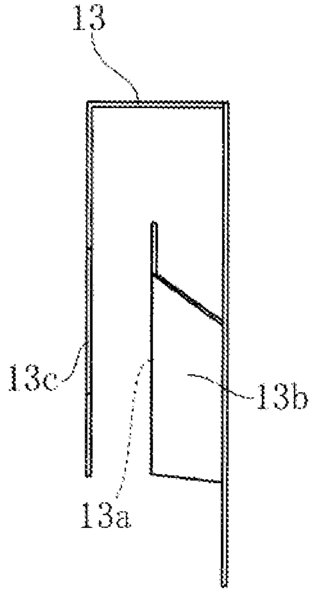
FIG. 17B is a side view of the holder of the LED lighting device shown in FIG. 12.
Figure 18:
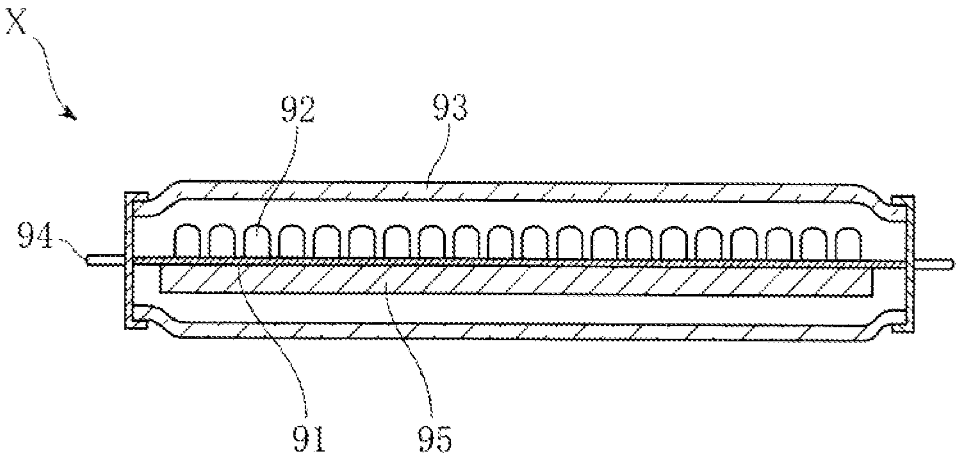
FIG. 18 is a sectional view showing an example of conventional LED lighting device.

The mount 1 includes a pair of holders 13. The holders 13 are attached to the ends of the main body 11 spaced from each other in direction x. As shown in FIGS. 17A and 17B, each of the holders 13 includes a fit portion 13*a*, a flexible portion 13*b* and a hook portion 13*c*. The fit portion 13*a* comprises a generally oval hole and receives the end portion 72 of the shaft 7. The flexible portion 13*b* holds the fit portion 13*a* and elastically deforms, when an external force is applied, to move the fit portion 13*a* outward in direction x. The hook portion 13*c* is positioned inward in direction x relative to the fit portion 13*a* and generally J-shaped.

Figure 16:
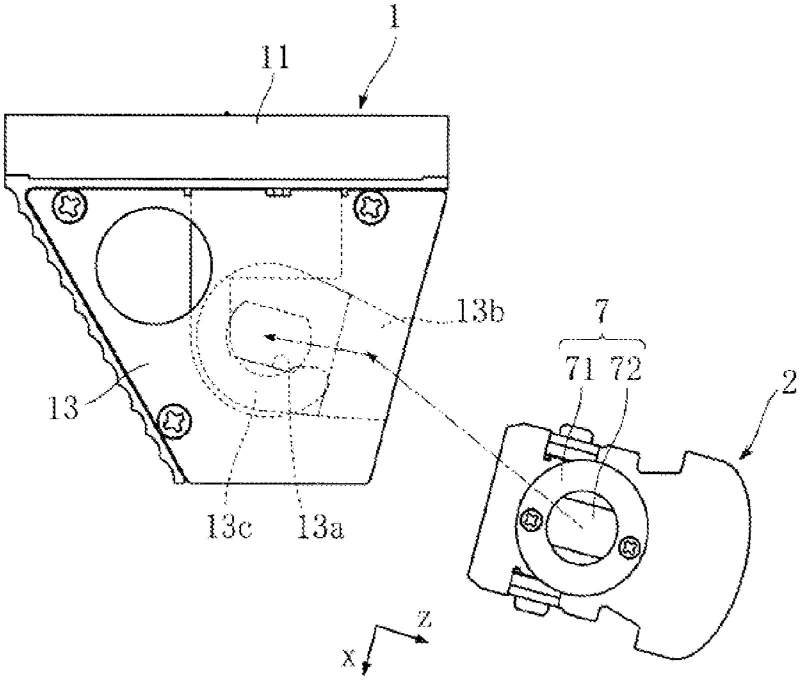
FIG. 16 is a side view showing how the LED unit is attached to the mount in assembling the LED lighting device shown in FIG. 12.

As shown in FIGS. 15 and 16, in attaching the LED unit 2 to the mount 1, the LED unit 2 is moved closer to the mount 1 to press the end portions 72 of the shafts 7 against the flexible portions 13*b* of the holders 13. As a result, the flexible portions 13*b* deform so that the fit portions 13*a* of the paired holders 13 move away from each other. By further pushing the LED unit 2, the end portions 72 fit into the fit portions 13*a* so that the flexible portions 13*b* return to their original shape. Thus, the LED unit 2 is easily attached to the mount 1 just by pushing. Further, even when the end portion 72 does not properly fit into the fit portion 13*a* in the attaching operation, the shafts 7 engage the hook portions 13*c*. Thus, in attaching the LED unit 2 or the like, the LED unit 2 is prevented from dropping.

Since the LED unit 2 is rotatable around the x direction in the LED lighting device A2, a portion of the wall above a store shelf, for example, can be selectively illuminated with light. The provision of the reflector 44*a* is suitable for illuminating a selected portion with high brightness.

The LED lighting device of the present invention is not limited to those described above. The specific structure of each part of the LED lighting device according to the present invention can be varied in design in many ways.

The present invention is not limited to the structure in which the LED modules 3 are mounted on the substrate 41. Instead of this structure, an insulating layer and a wiring pattern may be formed on the support member 4, and the LED modules 3 may be mounted on these. Although the structure as the LED module 3 is suitable for efficiently emitting light from the LED chip 32, the present invention is not limited to this. For instance, the LED chips 32 may be directly mounted on the substrate 41.

The invention claimed is:

1. An LED lighting device comprising:

a plurality of LED chips;

an LED unit in which the LED chips are mounted; and a mount holding the LED unit; wherein:

the LED unit is elongated in a first direction;

the LED chips emit light mainly along a second direction perpendicular to the first direction;

the mount is formed with a recess that is open in the second direction and that accommodates the LED unit;

the LED unit includes a support member that is U-shaped in cross section, the support member supporting the LED chips at a bottom thereof and opening in a direction opposite from a light emission direction of the LED chips along the second direction;

the LED unit further comprises a cover for transmitting light from the LED chips while diffusing the light;

the cover has a strip-like shape elongated in the first direction and is formed with a pair of engagement pieces at edges spaced from each other in a third direction perpendicular to both of the first and the second directions; and the support member is formed with a pair of cover engagement grooves that engage the engagement pieces.

2. The LED lighting device according to claim 1, wherein:

the LED unit is provided with a connector extending in a direction crossing the first direction and connected to the LED unit; and the LED unit reaches ends of the mount that are spaced from each other in the first direction.

3. The LED lighting device according to claim 1, wherein: the mount includes a holder including an engagement piece for holding the LED unit; and the LED unit is formed with a fixing engagement groove for engagement with the engagement piece.

4. The LED lighting device according to claim 3, wherein: the holder includes a pair of the engagement pieces arranged to sandwich the LED unit in a third direction perpendicular to both of the first and the second directions, the engagement pieces defining a distance therebetween in the third direction reducing as proceeding in a direction opposite from a light emission direction of the LED chips along the second direction; and the LED unit is provided with a pair of the fixing engagement grooves on sides spaced from each other in the third direction.

5. The LED lighting device according to claim 4, wherein the holder includes a flexible portion that is elastically deformable to move the paired engagement pieces away from each other in the third direction.

6. The LED lighting device according to claim 5, wherein the mount includes a space for allowing movement of the engagement pieces caused by deformation of the flexible portion in attaching the LED unit to the holder.

7. The LED lighting device according to claim 1, wherein:

the LED unit is elongated in a first direction and held by the mount rotatably relative to the mount around the first direction; and the LED chips emit light mainly along a second direction perpendicular to the first direction.

8. The LED lighting device according to claim 7, wherein: the LED unit is provided with a pair of shafts at ends spaced from each other in the first direction, each of the shafts including a root portion and an end portion rotatable relative to the root portion; and the mount is provided with a pair of holders each including a fit portion for fitting to the end portion.

9. The LED lighting device according to claim 8, wherein the holders include flexible portions, respectively, which are elastically deformable to move the fit portions away from each other in the first direction.

10. The LED lighting device according to claim 9, wherein each of the holders includes a hook portion that is positioned inward from the fit portion in the first direction and that engages a portion of the shaft that is closer to the root portion than a portion that fits to the fit portion is.

11. The LED lighting device according to claim 1, wherein the support member accommodates a power conversion portion for converting received electric power into output electric power for supply to the LED chips.

12. The LED lighting device according to claim 1, wherein the support member comprises a bracket U-shaped in cross section and a strip-like substrate attached to an outer side of a bottom of the bracket, the LED chips being mounted to the substrate, the substrate having a length in the first direction and a width in a third direction perpendicular to both of the first and the second directions.

13. The LED lighting device according to claim 1, wherein:

one of the engagement pieces includes a stepped portion that shifts an end of the engagement piece inward in the third direction, whereas the other one of the engagement pieces includes an engagement surface oriented in a light emission direction along the second direction and an inclined surface deviated from the engagement surface in a direction opposite from the light emission direction along the second direction and extending inward in the third direction as proceeding in the direction opposite from the light emission direction along the second direction;

one of the cover engagement grooves that engages the engagement piece including the stepped portion includes a recess dented in the direction opposite from the light emission direction along the second direction; and one of the cover engagement grooves that engages the engagement piece including the engagement surface and the inclined surface includes an engagement surface that engages said engagement surface and a projection deviated from the inclined surface in the direction opposite from the light emission direction along the second direction.

* * * * *